(12) United States Patent
Liu et al.

(10) Patent No.: US 10,915,096 B2
(45) Date of Patent: Feb. 9, 2021

(54) METHOD AND SYSTEM FOR QUICK CUSTOMIZED-DESIGN OF INTELLIGENT WORKSHOP

(71) Applicant: GUANGDONG UNIVERSITY OF TECHNOLOGY, Guangdong (CN)

(72) Inventors: Qiang Liu, Guangzhou Guangdong (CN); Jiewu Leng, Guangzhou Guangdong (CN); Ding Zhang, Guangzhou Guangdong (CN); Xin Chen, Guangzhou Guangdong (CN); Lijun Wei, Guangzhou Guangdong (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 16/820,638

(22) Filed: Mar. 16, 2020

(65) Prior Publication Data

US 2020/0249663 A1 Aug. 6, 2020

Related U.S. Application Data

(63) Continuation of application No. PCT/CN2018/109855, filed on Oct. 11, 2018.

(30) Foreign Application Priority Data

Oct. 17, 2017 (CN) .......................... 2017 1 0960941

(51) Int. Cl.
*G05B 19/418* (2006.01)
(52) U.S. Cl.
CPC .................. *G05B 19/41885* (2013.01); *G05B 2219/31343* (2013.01); *G05B 2219/31372* (2013.01);
(Continued)

(58) Field of Classification Search
CPC .... G05B 19/41885; G05B 2219/31343; G05B 2219/31372; G05B 2219/32342;
(Continued)

(56) References Cited

U.S. PATENT DOCUMENTS 10,388,075 B2 * 8/2019 Schmirler ............... G06F 3/147
10,535,202 B2 * 1/2020 Schmirler .......... G05B 23/0216
(Continued)

FOREIGN PATENT DOCUMENTS

CN 105787229 A 7/2016
CN 106530111 A 3/2017
(Continued)

*Primary Examiner* — Charles R Kasenge
(74) *Attorney, Agent, or Firm* — Wayne & Ken, LLC; Tony Hom

(57) ABSTRACT

The present invention relates to the technical field of industrial automation, and in particular to a method and system for quick customized-design of an intelligent workshop. The method comprises the following steps: step A: acquiring design requirement information of a production line, and performing modeling in a simulation system according to the design requirement information; step B: performing action planning of a physical stand-alone device, performing logistics and motion planning of articles being processed, and compiling motion and action control scripts; step C: establishing, by the digital twin technology, a communication channel among a PLC system of the workshop digitization model, a PLC system of a physical workshop device and a host computer; and, step D: outputting a three-dimensional digital twin model as a blueprint for follow-up design and development of the stand-alone device, a control system and an execution system.

7 Claims, 4 Drawing Sheets

(52) U.S. Cl.
CPC .............. *G05B 2219/32342* (2013.01); *G05B 2219/32365* (2013.01); *G05B 2219/34288* (2013.01); *G05B 2219/35012* (2013.01)

(58) Field of Classification Search
CPC ........... G05B 2219/32365; G05B 2219/34288; G05B 2219/35012; Y02P 90/30; Y02P 90/02; G06F 30/20
See application file for complete search history.

(56) References Cited

U.S. PATENT DOCUMENTS

| | | | |
|---|---|---|---|
| 10,620,612 B2* | 4/2020 | Chao | G05B 19/4185 |
| 10,699,419 B2* | 6/2020 | Cui | G05B 19/4183 |
| 10,735,691 B2* | 8/2020 | Schmirler | G06T 19/006 |
| 2011/0200464 A1 | 1/2011 | Maguire et al. | |
| 2018/0121170 A1* | 5/2018 | Subramaniyan | G06F 8/20 |
| 2018/0131907 A1* | 5/2018 | Schmirler | H04N 5/23238 |
| 2018/0196409 A1* | 7/2018 | Ben-Bassat | G06Q 10/0833 |
| 2018/0267496 A1* | 9/2018 | Wang | G05B 19/056 |
| 2019/0079996 A1* | 3/2019 | Mochel | G06F 16/248 |
| 2019/0087598 A1* | 3/2019 | Adkins | G06F 21/121 |

FOREIGN PATENT DOCUMENTS

| | | | |
|---|---|---|---|
| CN | 106774223 A | 5/2017 | |
| CN | 107832497 A | 3/2018 | |

* cited by examiner

METHOD AND SYSTEM FOR QUICK CUSTOMIZED-DESIGN OF INTELLIGENT WORKSHOP

CROSS-REFERENCE TO RELATED APPLICATIONS

This application is a continuation of International Patent Application No. PCT/CN2018/109855, filed on Oct. 11, 2018, which claims the benefit of priority from Chinese Patent Application No. 201710960941.3, filed on Oct. 17, 2017. The contents of the aforementioned application, including any intervening amendments thereto, are incorporated herein by reference in its entirety

TECHNICAL FIELD

The present invention relates to the technical field of industrial automation, and in particular to a method and system for quick customized-design of an intelligent workshop.

BACKGROUND OF THE PRESENT INVENTION

With the rapid development of intelligent manufacturing devices and communication technology, it is increasingly urgent for quick design and reasonable implementation of automated production lines in China's manufacturing industry. Aiming at meeting customers' differentiated demands, the customized-design uses technologies and methods such as selection, configuration and modification to form a new design scheme based on the basic type of the designed object. Methods for quick customized-design of workshops have become an urgent need for intelligent manufacturing. During the customized-design of workshops, it is necessary to quickly form a static workshop layout according to customers' differentiated requirements on production sites, expected capacities, process paths, legacy devices and the like, complete the action design of devices in workshops and the motion design of articles being processed, and realize the integrated design and optimization of an upper-level management system and a workshop. The customized-design of workshops will be extended to the integration of devices, control systems and management software, and will involve the adaptive correction of execution systems and engines and the adjustment of the execution efficiency. Most of devices to be used in a workshop are irregularly shaped, and controllers and communication interfaces are also different. However, special devices need to cooperate with each other or intermediate devices need to cooperate with special devices, so these devices will frequently communicate with each other. It is very difficult to realize the integration of the whole line of the workshop.

Existing technologies focus on the modeling and configuration of workshops, and place emphasis on the formation of the configuration space based on modularization. In combination with inference, optimization and other technologies, a design scheme in conformity with personalized requirements is formed; and, offline simulation and analysis are used together. More equivalently to static design, these technologies have following main disadvantages: (1) in the design schemes formed by the existing design methods, the integration of the workshop digital model and the upper-level management system is not taken into consideration, so it is unable to realize the online virtual operation of "driving the operation of the workshop digital model by sending a production instruction by the management system"; meanwhile, it is unable to realize instruction synchronization and information synchronization between a stand-alone digital model and a physical device, so that the actual production process cannot be truly simulated during the virtual operation of the workshop, and the reliability of related analysis results and verification results obtained by the virtual operation of the workshop digital model is low; (2) since the existing workshop customized-design process is seriously divorced from the workshop execution process and the design scheme is not evaluated online by the actual execution process, the design scheme cannot be adjusted and optimized according to the actual operation results, and consequently, the quality of the design scheme cannot be effectively ensured; and, (3) the serialization of the existing design process will lead to a too long design cycle, and due to the serialization of workshop layout, device integration, development of the control system and development of the management system in the existing workshop customized-design process, particularly a major change in a previous stage can directly lead to the re-execution of subsequent processes, resulting in high change cost and long cycle. In general, there are no effective, real-time, integrated verification methods, platforms and optimization technologies in the existing customized-design of workshops.

SUMMARY OF THE PRESENT INVENTION

In view of the above defects, an objective of the present invention is to provide a method and system for quick customized-design of an intelligent workshop, which is parallelized, fully-integrated, and interactively optimized in a design process and an execution process.

For this purpose, the present invention employs the following technical solutions.

A method for quick customized-design of an intelligent workshop, which is applied to an intelligent workshop design system, including the following steps:

step A: acquiring design requirement information of a production line, and performing modeling in a simulation system according to the design requirement information to establish a workshop digital model and a three-dimensional graphic model of each physical stand-alone device;

step B: performing action planning of each stand-alone device, performing logistics and motion planning of articles being processed, compiling motion and action control scripts, and performing an offline simulation operation until the offline operation is normal;

step C: establishing, by the digital twin technology, a communication channel among a PLC system of the workshop digital model, a PLC system of a physical workshop device and a host computer to realize interconnection and intercommunication of data and information, and realizing, by the binary synchronization technology using downlink instructions and uplink information, real-time synchronization of real-time data of the physical device, monitored data of the host computer and three-dimensional virtual simulation data to obtain a three-dimensional digital twin model of the intelligent workshop; and step D: outputting the three-dimensional digital twin model of the workshop as a blueprint for follow-up design and development of the stand-alone device, a control system and an execution system, and performing integration and synchronization, by a virtual control network, with the three-dimensional digital twin model to synchronously realize online debugging.

More preferably, in the step A, the method for establishing the workshop digital model includes: in accordance with the building structure of the workshop and by comprehensively considering the workshop logistics form, the manufacturing process, the production and organization form, the device geometry and the like, performing an overall layout of the production line; if the occupied space of the workshop is an elongated region and material inlet and outlet of the workshop are located on different sides of the workshop, designing the production line of the workshop to be a linear or L-shaped layout; and, if the occupied space of the workshop is a square region, designing the production line of the workshop to be a U-shaped layout when the material outlet and inlet of the workshop are located on a same side of the workshop, and designing the production line of the workshop to be an S-shaped layout when the material outlet and inlet of the workshop are located on different sides.

More preferably, in the step A, the method for establishing the workshop digital model includes: according to the selected model of stand-alone devices and by preliminarily considering the capacity balance of the workshop, performing three-dimensional graphic modeling of special devices in the stand-alone devices, performing three-dimensional graphic modeling of devices in a transport link and devices in a storage link included in intermediate devices in the stand-alone devices, and performing virtual assembling of the workshop in a three-dimensional virtual design platform according to the layout of the production line.

More preferably, in the step A, during the three-dimensional graphic modeling of special devices in the stand-alone devices, mobile devices and non-mobile devices are modeled, respectively.

Specifically, the step C further includes: building a virtual control network, and establishing, by the digital twin technology, a physical simulation platform which is synchronized both virtually and physically so that the stand-alone device can realize action synchronization with a corresponding stand-alone digital model on a digital workshop; and, integrating an upper-level MES system with the workshop digital twin model to realize the operation of the whole line under a generated MES instruction, and feeding the execution of the workshop digital twin model back to the MES to realize the online simulation operation.

Specifically, in the step C, the method for integrating the upper-level MES system with the workshop digital twin model includes: establishing, by a control network and configuration software, an instruction channel and an information channel for data interaction, and realizing, by an downlink instruction channel and an uplink information channel, connection and data synchronization of the workshop digital twin model with the upper-level MES system and an intelligent management system.

More preferably, an iterative optimization step is further provided between the step C and the step D: a batch of orders are simulated in the MES system, the completion rate of the orders within the specified time limit, the balance rate of the production line, the device activation rate and the line robustness, brittleness and flexibility of the whole production line are analyzed by using the operation result, a design scheme for the intelligent workshop is further adjusted according to the analysis indexes so as to optimize the analysis indexes, and the above steps are executed in iterations to control the performance of the workshop.

Specifically, in the step A, the three-dimensional graphic model of stand-alone devices is a three-dimensional CAD model obtained by CAD three-dimensional design software, and moving components of the stand-alone devices in the model can be independently represented and identified.

Specifically, the host computer in the step C is configuration software.

A system for quick customized-design of an intelligent workshop is provided, to which the method for quick customized-design of an intelligent workshop described above is applied, including: a host computer, a simulation system and a PLC; the simulation system, the host computer and the PLC establish a communication network for field information and digital instructions; the simulation system is configured to acquire design requirement information of a production line and perform three-dimensional modeling according to the design requirement information to establish a digital model of a workshop and a three-dimensional graphic model of a physical stand-alone device; the simulation system and the physical stand-alone device are both connected to the PLC; the PLC includes a synchronization control module configured to drive a simulated model of the production line and the physical stand-alone device to act synchronously through data and acquire real-time state data of the simulated model of the production line and the physical stand-alone device; the host computer includes a configuration monitoring system, an ERP system and an MES management unit, wherein the configuration monitoring system is configured to receive the real-time state data to establish a configuration monitoring graph by which the simulated model of the production line and the physical stand-alone device are monitored in real time; and, the MES management unit is configured to transmit a test instruction to the PLC, receive the real-time state data for analysis, generate a test result of the physical stand-alone device, and generate an optimized production line design scheme according to the test result of the physical stand-alone device.

By the method for quick customized-design of an intelligent workshop, the communication of instructions and digital information among the workshop digital model, the three-dimensional graphic model of each physical stand-alone device and the host computer can be realized by the digital twin technology, so that the design, assembly, debugging, optimization, monitoring, data output and the like of the production line are realized. During the manufacturing process of the production line, by semi-physical simulation, a physical stand-alone device, as a unit to be tested in the production line, is embedded into a corresponding production line unit in the simulated model of the production line, and the real production line is replaced or partially replaced by semi-simulation. In this way, instead of debugging and optimization after the whole production line is manufactured and assembled, unit testing and integration testing can be performed on each unit during the design and manufacturing process of the production line. Accordingly, the design scheme of the production line is timely corrected and optimized, the debugging cycle is shortened, and the investment cost is reduced.

By analyzing, by the host computer, real-time data of sensors in the physical stand-alone device and the simulated model of the production line, performing iterative optimization of the design scheme and physical execution, and generating an optimized design scheme for the production line, the rationality of the production line design is effectively improved. By the simulated operation of the production line and the analysis of device activation rate, production balance rate, system robustness and the like during the simulated operation by means of semi-physical simulation, a production line design scheme with the highest device operation efficiency can be obtained without repeated debugging in a huge real production line, and the optimized production line design scheme can be directly applied in a real production system. Accordingly, the production investment is reduced, and the uncertainty from design to production is decreased. Thus, the time from design to production of products is shortened, the reliability and yield of products are improved, the stability of the system is ensured, and the development and production cycle of products is greatly shortened. Moreover, value chains of the whole enterprise are effectively superposed together, so the marketing of products is accelerated, and the quality of products is improved.

DETAILED DESCRIPTION OF THE PRESENT INVENTION

Figure 1:
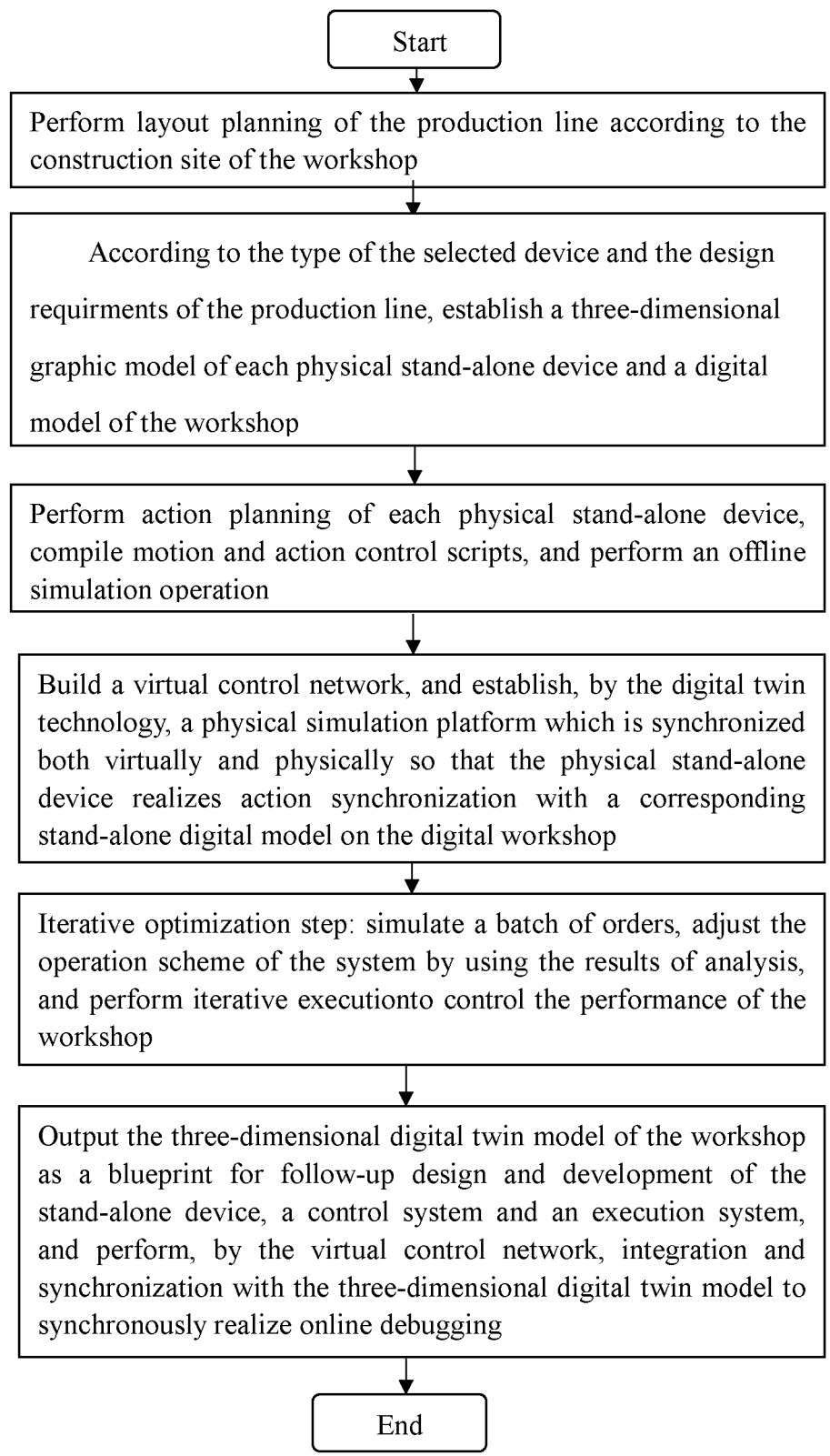
FIG. 1 is a flowchart of a method for quick customized-design of an intelligent workshop according to an embodiment of the present invention.
Figure 2:
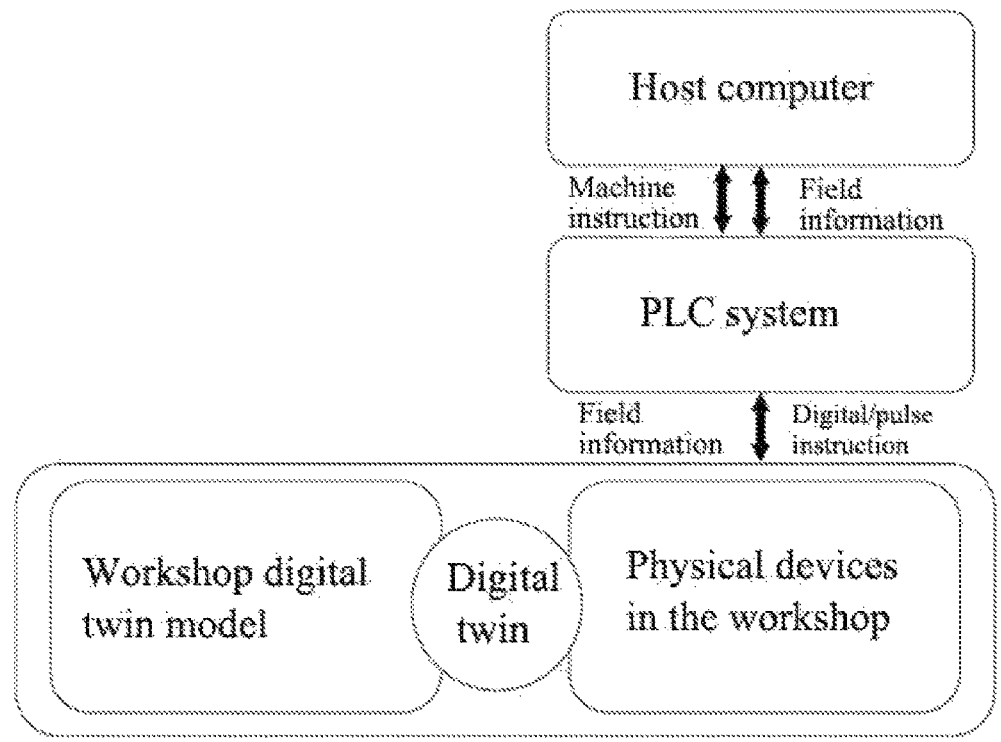
FIG. 2 is a schematic architecture diagram of establishing a communication network for field information and digital instructions among the simulation system, the host computer and the PLC according to an embodiment of the present invention.
Figure 3:
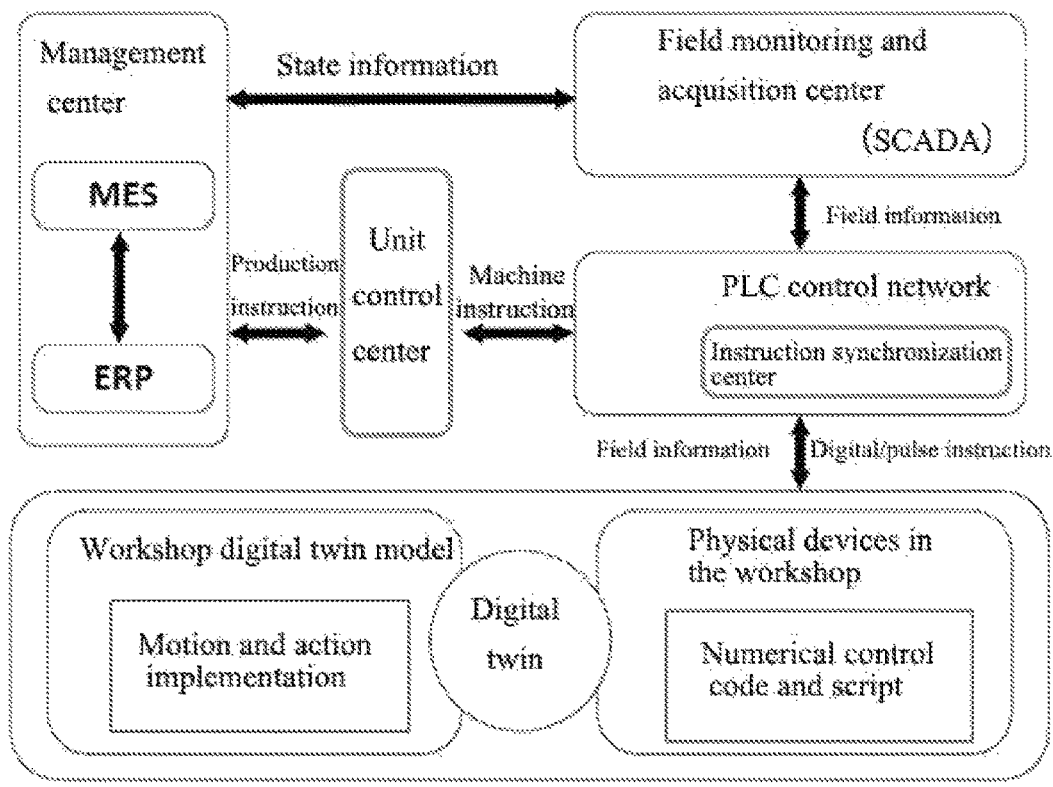
FIG. 3 is a principle diagram of the operation of a system for quick customized-design of an intelligent workshop according to an embodiment of the present invention.

The technical solutions of the present invention will be further described below by specific implementations with reference to the accompanying drawings.

As shown in FIGS. 1-5, a method for quick customized-design of an intelligent workshop is provided, which is applied to an intelligent workshop design system. The method for quick customized-design of an intelligent workshop includes the following steps.

Step A: Design requirement information of a production line is acquired, and modeling is performed in a simulation system according to the design requirement information to establish a workshop digital model and a three-dimensional graphic model of each physical stand-alone device. Specifically, the step A includes the following steps: step A1: during the establishment of the workshop digital model, in accordance with the building structure of the workshop and by comprehensively considering the workshop logistics form, the manufacturing process, the production and organization form, the device geometry and the like, an overall layout of the production line is performed; if the occupied space of the workshop is an elongated region and material inlet and outlet of the workshop are located on different sides of the workshop, the production line of the workshop is designed to be a linear or L-shaped layout; and, if the occupied space of the workshop is a square region, the production line of the workshop is designed to be a U-shaped layout when the material outlet and inlet of the workshop are located on a same side of the workshop, and the production line of the workshop is designed to be an S-shaped layout when the material outlet and inlet of the workshop are located on different sides; and, step A2: during the establishment of the workshop digital model, according to the selected model of stand-alone devices and by preliminarily considering the capacity balance of the workshop, three-dimensional graphic modeling of special devices in the stand-alone devices is performed, three-dimensional graphic modeling of intermediate devices (e.g., devices in a transport link and devices in a storage link) in the stand-alone devices is performed, and virtual assembling of the workshop is performed in a three-dimensional virtual design platform according to the layout of the production line. During the three-dimensional graphic modeling of special devices in the stand-alone devices, mobile devices and non-mobile devices are modeled, respectively. The three-dimensional graphic model of stand-alone devices is a three-dimensional CAD model obtained by CAD three-dimensional design software, and moving components of the stand-alone devices in the model can be independently represented and identified.

Step B: Action planning of each stand-alone device is performed, logistics and motion planning of articles being processed is performed, motion and action control scripts are compiled, and an offline simulation operation is performed until the offline operation is normal.

Step C: A communication channel among a PLC system of the workshop digital model, a PLC system of a physical workshop device and a host computer is established by the digital twin technology to realize interconnection and inter-communication of data and information, and real-time synchronization of real-time data of the physical device, monitored data of the host computer and three-dimensional virtual simulation data is realized by the binary synchronization technology using downlink instructions and uplink information to obtain a three-dimensional digital twin model of the intelligent workshop. Specifically, the step C includes the following steps: a virtual control network is built, a physical simulation platform which is synchronized both virtually and physically is established by the digital twin technology so that the stand-alone device can realize action synchronization with a corresponding stand-alone digital model on a digital workshop; and, an upper-level MES system is integrated with the workshop digital twin model to realize the operation of the whole line under a generated MES instruction, and the execution of the workshop digital twin model is fed back to the MES to realize the online simulation operation. During the integration of the upper-level MES system with the workshop digital twin model, an instruction channel and an information channel are established for data interaction by a control network and configuration software, and connection and data synchronization of the workshop digital twin model with the upper-level MES system and an intelligent management system are realized by a downlink instruction channel and an uplink information channel.

An iterative optimization step is further included: a batch of orders are simulated in the MES system, the completion rate of the orders within the specified time limit, the balance rate of the production line, the device activation rate and the line robustness, brittleness and flexibility of the whole production line are analyzed by using the operation result, a design scheme for the intelligent workshop is further adjusted according to the analysis indexes so as to optimize the analysis indexes, and the optimization process "simulation operation-performance analysis-scheme adjustment" is executed in iterations to control the performance of the workshop.

Step D: The three-dimensional digital twin model of the workshop is output as a blueprint for follow-up design and development of the stand-alone device, a control system and an execution system, and integration and synchronization are performed, by a virtual control network, with the three-dimensional digital twin model to synchronously realize online debugging.

A system for quick customized-design of an intelligent workshop is provided, to which the method for quick customized-design of an intelligent workshop described above is applied, including a host computer, a simulation system and a PLC.

The simulation system, the host computer and the PLC establish a communication network for field information and digital instructions.

The simulation system is configured to acquire design requirement information of a production line and perform three-dimensional modeling according to the design requirement information to establish a digital model of a workshop and a three-dimensional graphic model of a physical stand-alone device.

The simulation system and the physical stand-alone device are both connected to the PLC.

The PLC includes a synchronization control module configured to drive a simulated model of the production line and the physical stand-alone device to act synchronously through data and acquire real-time state data of the simulated model of the production line and the physical stand-alone device.

The host computer includes a configuration monitoring system, an ERP system and an MES management unit. The configuration monitoring system is configured to receive the real-time state data to establish a configuration monitoring graph and monitor the simulated model of the production line and the physical stand-alone device in real time.

The MES management unit is configured to transmit a test instruction to the PLC, receive the real-time state data for analysis, generate a test result of the physical stand-alone device, and generate an optimized production line design scheme according to the test result of the physical stand-alone device.

The configuration software is one of various kinds of host computer software. The configuration software is a subordinate concept of host computer software. The configuration software is also called configuration monitoring system software. The configuration software is in a software platform and development environment in a monitoring level of the automatic control system, and provides, in flexible configurations, users with general-purpose software tools that quickly construct a monitoring function of the industrial automatic control system.

As a manufacturing execution system for manufacturing enterprises, the MES (Manufacturing Execution System) is a production information management system oriented to the workshop execution layer of the manufacturing enterprises. The MES can provide enterprises with management modules such as manufacturing data management, planning and scheduling management, production scheduling management, inventory management, quality management, human resource management, operating center/device management, tool and fixture management, procurement management, cost management, project dashboard management, production process control, underlying data integration and analysis, and upper-level data integration and decomposition, and build a strong, reliable, comprehensive and feasible manufacturing collaboration management platform for enterprises.

The ERP (the abbreviation of enterprise resource planning) system is a management platform which, established based on the information technology, integrates the information technology with advanced management ideas and provides decision means for enterprise employees and the decision-making personnel from systematic management ideas.

Digital twin is a simulation process of integrating multiple disciplines, multiple physical quantities, multiple dimensions and multiple probabilities by fully utilizing physical models, sensor updates, operation histories and other data. Mapping is performed in a virtual space to reflect the full life cycle of a corresponding physical device. It is also called "digital mirroring", "digital twins" or "digital mapping".

Figure 5:
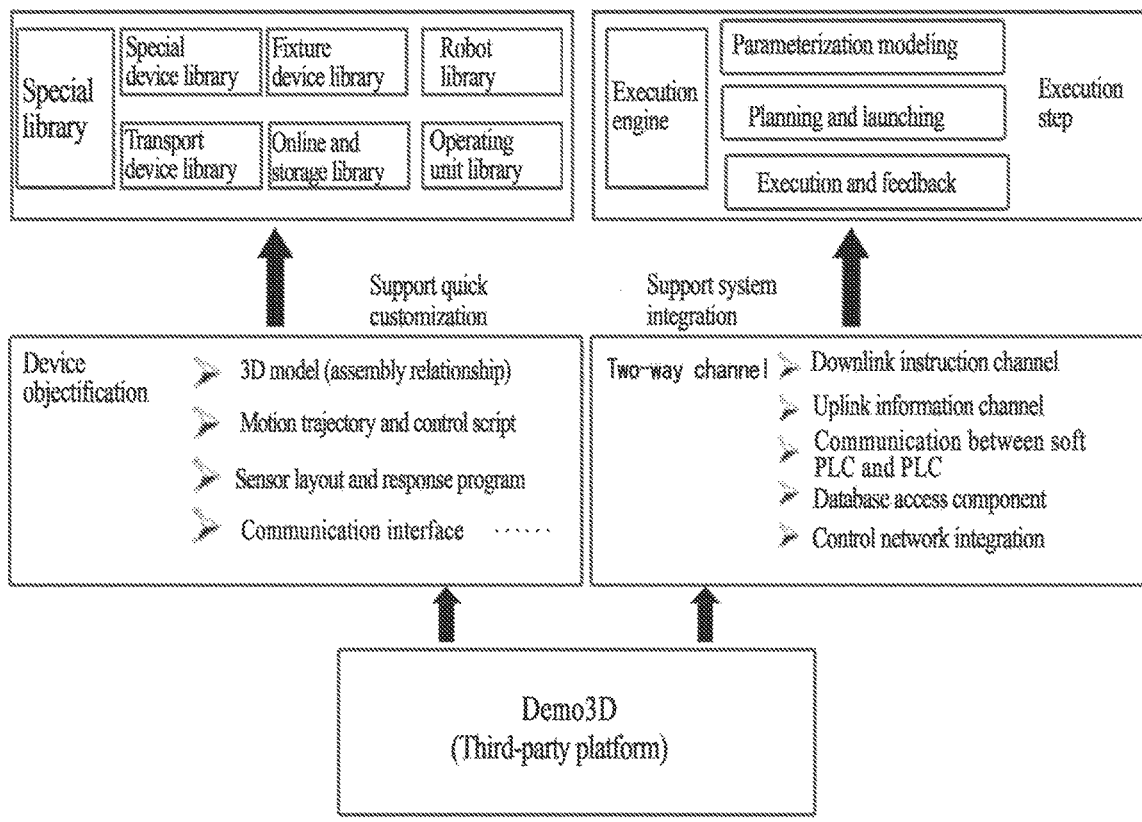
FIG. 5 is a principle diagram of erection of the system for quick customized-design of an intelligent workshop according to the present invention.

As shown in FIG. 5, the erection principle of the system for quick customized-design of an intelligent workshop will be described. Based on a third-party three-dimensional design platform, information such as 3D models (assembly references/structures) of special devices, transport devices, assembly/disassembly devices, storage devices and other devices, motion trajectories of moving components, sensing devices and control scripts, and communication standards is packaged into objects, parameter models of the objects are extracted, and a special device library is established to support the quick customized-design of the workshop. The establishment of the downlink instruction channel and the uplink information channel relies on the communication between soft PLC and PLC, control network integration, shared data structures and macro-objects, database access components and other mechanisms. The real-time instruction communication and field information communication of the platform with the upper-level MES system and the engine thereof and the lower-level devices are supported so as to support near-physical simulation and semi-physical simulation of the workshop.

The system for quick customized-design of an intelligent workshop establishes, by using the PLC as a bridge and by the digital twin technology, a communication channel among the soft PLC of the workshop digital model, the PLC of the physical device in the workshop and the configuration software so as to realize interconnection and intercommunication of data and information. Moreover, by the binary synchronization technology using downlink instructions and uplink information, real-time synchronization of real-time data of devices, configuration monitoring data and three-dimensional virtual simulation data is realized so as to realize the action synchronization between a virtual workshop (digital model) and a real workshop (physical device). Data interaction between the instruction channel and the information channel is established by a control network and an SCADA system, and the connection and data synchronization of the workshop digital twin model, the upper-level MES system and the intelligent management system is realized by the downlink instruction channel and the uplink information channel.

The present invention has the following main beneficial effects.

(1) The design scheme is visual in three dimensions, so that the design deviations caused by insufficient interaction between customers and designers with language or two-dimensional drawings are avoided as soon as possible, and the cost for design correction is greatly reduced.

(2) The quality of the design scheme can be quickly evaluated and optimized, the execution efficiency of the design scheme is online analyzed and evaluated by virtual execution, and responsive scheme adjustment is performed. The design quality is improved by such iterative optimization.

Figure 4:
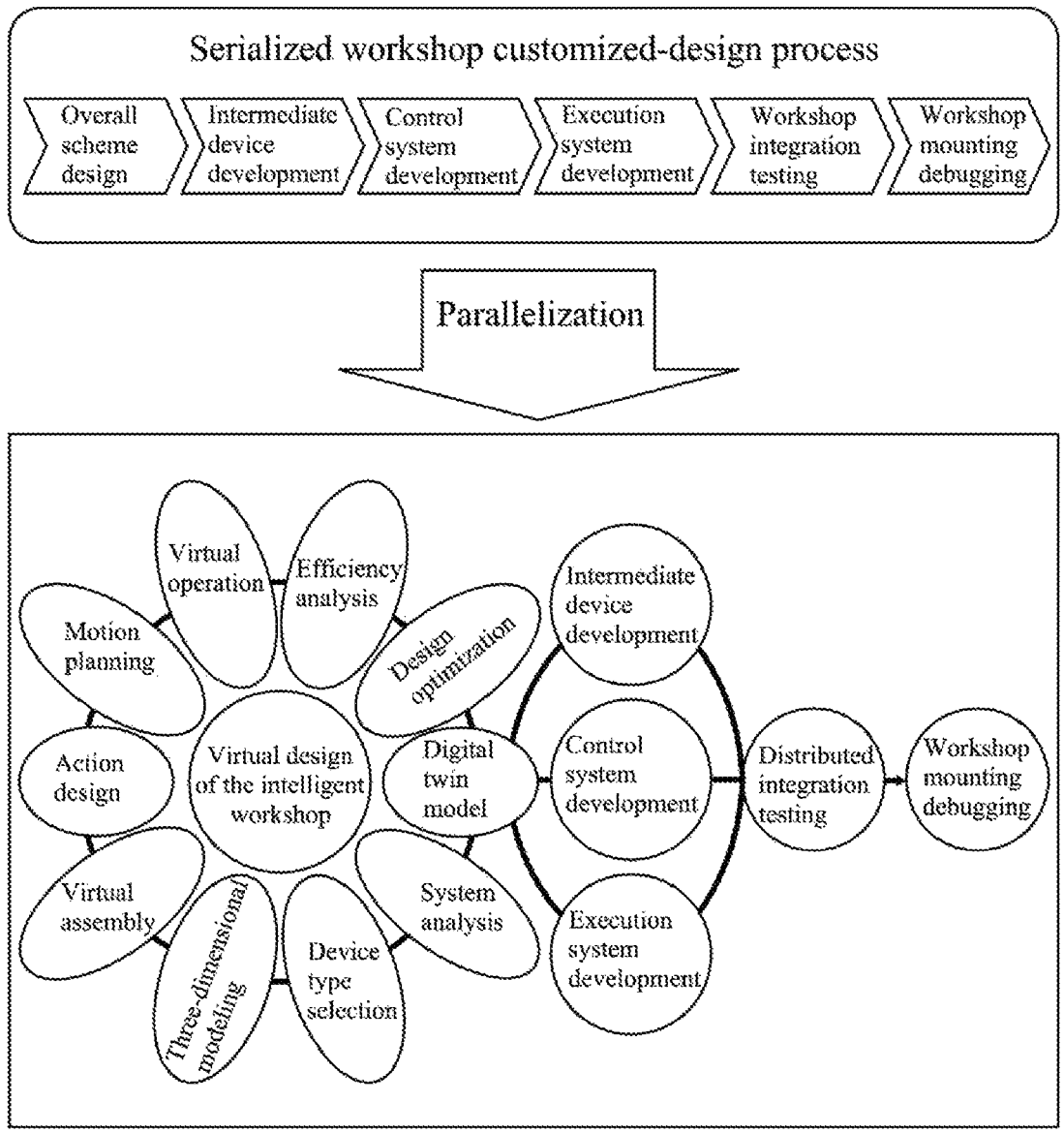
FIG. 4 is a comparison diagram of a serialized workshop customized-design process in the prior art and a parallelized workshop customized-design process in the present invention.

(3) The customized-design cycle is greatly shortened. As shown in FIG. 4, in the present invention, the conventional serialized workshop customized-design process is changed to a parallelized process. First, the conventional overall scheme design is replaced with the virtual design of a workshop. In this process, a three-dimensional digital twin model of the workshop is formed, including workshop layout, device action, movement mode of articles being processed and the like; and preliminary design optimization is completed. Then, stand-alone devices, control systems and execution systems are simultaneously developed by using the three-dimension digital twin model of the workshop as a blueprint, and integration and synchronization with the three-dimensional digital twin model are performed via the virtual control network to synchronously realize online debugging so as to realize the parallelized development process. Thus, the number of design products is decreased and the design cycle is shortened.

(4) The integration cycle of the whole production line of the workshop is greatly reduced, the physical device is integrated in segments by the digital twin technology, distributed integration prior to final assembly is realized, errors in control logic and logistics design are avoided locally, the time for online debugging and testing is shortened, and the cost for site occupation and fund occupation is reduced.

The technical principle of the present invention has been described above by specific embodiments. The descriptions are merely for explaining the principle of the present invention, and shall not be interpreted as limiting the protection scope of the present invention in any way. Based on the explanations here, those skilled in the art can conceive of other specific implementations of the present invention without paying any creative effort, and these implementations shall fall into the protection scope of the present invention.

What is claimed is:

1. A method for quick customized-design of an intelligent workshop, which is applied to an intelligent workshop design system, comprising the following steps:
    step A: acquiring design requirement information of a production line, and performing modeling in a simulation system according to the design requirement information to establish a three-dimensional graphic model of each physical stand-alone device to be accommodated in the intelligent workshop and a workshop digital model;
    step B: performing action planning of each physical stand-alone device, performing logistics and motion planning of articles being processed, compiling motion and action control scripts, and performing an offline simulation operation;
    step C: establishing, by a digital twin technology, a communication channel among a PLC system of the workshop digital model, a PLC system of a physical workshop device and a host computer to realize interconnection and intercommunication of data and information, and realizing, by a binary synchronization technology using downlink instructions and uplink information, real-time synchronization of real-time data of the physical device, monitored data of the host computer and three-dimensional virtual simulation data to obtain a three-dimensional digital twin model of the intelligent workshop; and
    step D: outputting the three-dimensional digital twin model of the workshop as a blueprint for follow-up design and development of the stand-alone device, to a control system and an execution system;
    the step C further comprises: building a virtual control network, and establishing, by the digital twin technology, a physical simulation platform which is synchronized both virtually and physically so that the stand-alone device can realize action synchronization with a corresponding stand-alone digital model on a digital workshop; and, integrating an upper-level MES system with the workshop digital twin model to realize the operation of the whole production line under a generated MES instruction, and feeding an execution of the workshop digital twin model back to the MES system to realize an online simulation operation;
    in the step C, the method for integrating the upper-level MES system with the workshop digital twin model comprises: establishing, by a control network and configuration software, an instruction channel and an information channel for data interaction, and realizing, by a downlink instruction channel and an uplink information channel, connection and data synchronization of the workshop digital twin model with the upper-level MES system and an intelligent management system; and
    an iterative optimization step is further provided between the step C and the step D: a batch of orders are simulated in the MES system, to analyze the following analysis indices: a completion rate of the orders within a specified time limit, a balance rate of the production line, a device activation rate and a line robustness, brittleness and flexibility of the whole production line, wherein a design scheme for the intelligent workshop is further adjusted according to the analysis indices so as to optimize the analysis indices, and the above steps are executed in iterations to control the performance of the workshop.

2. The method for quick customized-design of an intelligent workshop according to claim 1, wherein, in the step A, the method for establishing the workshop digital model comprises: in accordance with a building structure of the workshop and by comprehensively considering a workshop logistics form, a manufacturing process, a production and organization form, a device geometry, performing an overall layout of the production line; if the occupied space of the workshop is an elongated region and material inlet and outlet of the workshop are located on different sides of the workshop, designing the production line of the workshop to be a linear or L-shaped layout; and, if the occupied space of the workshop is a square region, designing the production line of the workshop to be a U-shaped layout when the material outlet and inlet of the workshop are located on a same side of the workshop, and designing the production line of the workshop to be an S-shaped layout when the material outlet and inlet of the workshop are located on different sides.

3. The method for quick customized-design of an intelligent workshop according to claim 2, wherein, in the step A, the method for establishing the workshop digital model comprises: according to a selected model of stand-alone devices and by preliminarily considering the capacity balance of the workshop, performing three-dimensional graphic modeling of special devices in the stand-alone devices, performing three-dimensional graphic modeling of devices in a transport link and devices in a storage link included in intermediate devices in the stand-alone devices, and performing virtual assembling of the workshop in a three-dimensional virtual design platform according to the layout of the production line.

4. The method for quick customized-design of an intelligent workshop according to claim 3, wherein, in the step A, during the three-dimensional graphic modeling of special devices in the stand-alone devices, mobile devices and non-mobile devices are modeled, respectively.

5. The method for quick customized-design of an intelligent workshop according to claim 1, wherein, in the step A, the three-dimensional graphic model of stand-alone devices is a three-dimensional CAD model obtained by CAD three-dimensional design software, and moving components of the stand-alone devices in the model can be independently represented and identified.

6. The method for quick customized-design of an intelligent workshop according to claim 1, wherein the host computer in the step C is configuration software.

7. A system for quick customized-design of an intelligent workshop, to which the method for quick customized-design of an intelligent workshop according to claim 1 is applied, comprising:
 a host computer, a simulation system and a PLC;
 the simulation system, the host computer and the PLC establish a communication network for field information and digital instructions;
 the simulation system is configured to acquire design requirement information of a production line and perform three-dimensional modeling according to the design requirement information to establish a digital model of a workshop and a three-dimensional graphic model of a physical stand-alone device;
 the simulation system and the physical stand-alone device are both connected to the PLC;
 the PLC comprises a synchronization control module configured to drive a simulated model of the production line and the physical stand-alone device to act synchronously through data and acquire real-time state data of the simulated model of the production line and the physical stand-alone device;
 the host computer comprises a configuration monitoring system, an ERP system and an MES management unit, wherein the configuration monitoring system is configured to receive the real-time state data to establish a configuration monitoring graph by which the simulated model of the production line and the physical stand-alone device are monitored in real time; and
 the MES management unit is configured to transmit a test instruction to the PLC, receive the real-time state data for analysis, generate a test result of the physical stand-alone device, and generate an optimized production line design scheme according to the test result of the physical stand-alone device.

* * * * *